(12) United States Patent
You et al.

(10) Patent No.: US 12,341,145 B2
(45) Date of Patent: Jun. 24, 2025

(54) METHOD FOR FORMING CONDUCTIVE PATTERN AND DISPLAY DEVICE INCLUDING CONDUCTIVE PATTERN

(71) Applicant: Samsung Display Co., Ltd., Yongin-Si (KR)

(72) Inventors: Jun Woo You, Seongnam-si (KR); Byoung Dae Ye, Yongin-si (KR); Tae Ho Lee, Hwaseong-si (KR); Atsushi Nemoto, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 16/941,606

(22) Filed: Jul. 29, 2020

(65) Prior Publication Data

US 2021/0193686 A1 Jun. 24, 2021

(30) Foreign Application Priority Data

Dec. 18, 2019 (KR) .......................... 10-2019-0169822

(51) Int. Cl.
*H01L 27/12* (2006.01)
*G02F 1/1362* (2006.01)

(52) U.S. Cl.
CPC ...... *H01L 27/124* (2013.01); *G02F 1/136286* (2013.01); *H01L 27/1288* (2013.01); *G02F 1/136295* (2021.01)

(58) Field of Classification Search
CPC .............. H01L 27/124; H01L 27/1288; G02F 1/136286; G02F 1/136295
USPC ......................................................... 257/79
See application file for complete search history.

(56) References Cited

U.S. PATENT DOCUMENTS

| | | | |
|---|---|---|---|
| 3,978,248 A * | 8/1976 | Usami | C04B 35/111 427/125 |
| 4,830,691 A | 5/1989 | Kida et al. | |
| 9,820,377 B2 | 11/2017 | Katagiri et al. | |
| 9,820,380 B2 | 11/2017 | Katagiri et al. | |
| 10,353,293 B2 * | 7/2019 | Ebihara | G03F 7/20 |
| 11,173,737 B2 | 11/2021 | Arutinov | |
| 11,195,635 B2 | 12/2021 | Anai et al. | |

(Continued)

FOREIGN PATENT DOCUMENTS

| | | |
|---|---|---|
| CN | 105247626 A | 1/2016 |
| CN | 105593950 A | 5/2016 |

(Continued)

OTHER PUBLICATIONS

Chinese Office Action corresponding to Application No. 202011460844.6, dated on Jul. 25, 2024, 7 pages.

*Primary Examiner* — Ori Nadav
(74) *Attorney, Agent, or Firm* — Innovation Counsel LLP

(57) ABSTRACT

A conductive pattern forming method according to an embodiment includes: forming a first conductive pattern on a substrate; sequentially forming a release layer and a conductive layer on a transfer substrate that includes a mask; irradiating intense pulsed light (IPL) to the substrate where the first conductive pattern is formed; placing the transfer substrate on the substrate; transferring a portion of the conductive layer, corresponding to an opening of the mask, onto the substrate by irradiating the IPL to the transfer substrate to form a second conductive pattern on the substrate.

9 Claims, 16 Drawing Sheets

(56) References Cited

U.S. PATENT DOCUMENTS

| | | | | |
|---|---|---|---|---|
| 2005/0118362 A1* | 6/2005 | Kim | ................... | B41M 5/38214 |
| | | | | 428/32.81 |
| 2010/0123132 A1* | 5/2010 | Nakata | ................ | H01L 29/7869 |
| | | | | 257/E29.1 |
| 2013/0048201 A1* | 2/2013 | Lee | ....................... | B05C 1/0834 |
| | | | | 156/379.6 |
| 2016/0216790 A1* | 7/2016 | Ebihara | ................ | G06F 3/0446 |
| 2020/0313092 A1* | 10/2020 | You | ..................... | H01L 51/0021 |

FOREIGN PATENT DOCUMENTS

| | | | |
|---|---|---|---|
| CN | 111433866 | A | 7/2020 |
| JP | 2006-140264 | A | 6/2006 |
| KR | 10-0858722 | B1 | 9/2008 |
| KR | 10-1116762 | B1 | 2/2012 |
| KR | 10-1220628 | B1 | 1/2013 |
| KR | 10-2014-0094789 | A | 7/2014 |
| KR | 10-2015-0079685 | A | 7/2015 |
| KR | 10-2019-0039794 | A | 4/2019 |

\* cited by examiner

METHOD FOR FORMING CONDUCTIVE PATTERN AND DISPLAY DEVICE INCLUDING CONDUCTIVE PATTERN

CROSS-REFERENCE TO RELATED APPLICATION

This application claims priority to and the benefit of Korean Patent Application No. 10-2019-0169822 filed in the Korean Intellectual Property Office on Dec. 18, 2019, the entire contents of which are incorporated herein by reference.

BACKGROUND

(a) Technical Field

This disclosure relates to a conductive pattern forming method and a display device including the conductive pattern, and more particularly, it relates to a method for forming a minute conductive pattern and a display device including such a conductive pattern.

(b) Description of the Related Art

A display device such as a light emitting display device, a liquid crystal display (LCD), and the like includes a display panel which displays an image. The display panel may be manufactured by forming several layers and elements on a substrate.

The display panel may include a display area through which the image is displayed and a non-display area where a driving circuit, a signal line, and the like are disposed. Since a wider screen can be provided as the non-display area is reduced, efforts are being made to reduce the non-display area. However, miniaturization of a conductive pattern such as wiring or a pad in the non-display area may cause degradation in reliability of the display device.

SUMMARY

Embodiments have been made in an effort to provide a method of forming a minute conductive pattern, and a display device including such a conductive pattern.

A conductive pattern forming method according to an embodiment includes: sequentially forming a release layer and a conductive layer on a transfer substrate that includes a mask; irradiating intense pulsed light (IPL) to a substrate; placing the transfer substrate on the substrate; transferring a portion of the conductive layer, corresponding to an opening of the mask, onto the substrate by irradiating the IPL to the transfer substrate to form a conductive pattern on the substrate.

The conductive layer may be formed by applying a metal paste or metal ink.

The conductive layer may be a metal layer.

The release layer may be a dynamic release layer.

The conductive pattern may be the conductive layer corresponding to the opening of the mask.

The placing the transfer substrate onto the substrate may include placing a surface of the transfer substrate, on which the conductive layer is located, to face toward the substrate.

The conductive pattern forming method may further include sintering the conductive pattern by irradiating IPL to the substrate where the conductive pattern is formed.

The conductive pattern may have a width of about 10 μm or less and a thickness of about 10% or more of the width.

A conductive pattern forming method according to an embodiment includes: forming a first conductive pattern on a substrate; sequentially forming a release layer and a conductive layer on a transfer substrate that includes a mask; irradiating intense pulsed light (IPL) to the substrate where the first conductive pattern is formed; placing the transfer substrate on the substrate; transferring a portion of the conductive layer, corresponding to an opening of the mask, onto the substrate by irradiating the IPL to the transfer substrate to form a second conductive pattern on the substrate.

The conductive layer may be formed by applying a metal paste or metal ink, or through metal deposition.

The release layer may be a dynamic release layer.

The second conductive pattern may be the conductive layer corresponding to the opening of the mask.

The placing the transfer substrate onto the substrate may include placing a surface of the transfer substrate, on which the conductive layer is located, to face toward the substrate.

The conductive pattern forming method may further include sintering the conductive pattern by irradiating IPL to the substrate where the second conductive pattern is formed.

The first conductive pattern may be a terminal electrode or a wire, and the second conductive pattern may be a bump.

The conductive pattern may have a width of 10 μm or less and a thickness of about 10% or more of the width.

According to the embodiments, a minute conductive pattern having a predetermined thickness can be formed, and a display device including such a minute conductive pattern can be provided.

DETAILED DESCRIPTION OF THE EMBODIMENTS

Figure 1:
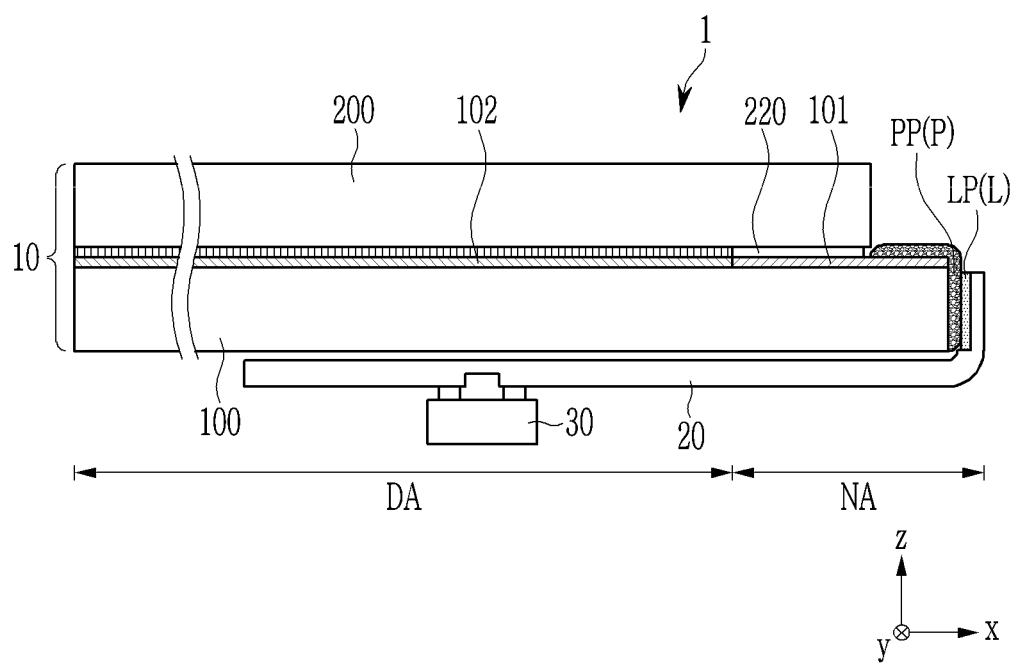
FIG. 1 is a side view of a display device according to an embodiment.

The inventive concept will be described more fully hereinafter with reference to the accompanying drawings, in which embodiments of the inventive concept are shown. As those skilled in the art would realize, the described embodiments may be modified in various different ways, all without departing from the spirit or scope of the inventive concept.

The drawings and description are to be regarded as illustrative in nature and not restrictive. Like reference numerals designate like elements throughout the specification.

Further, in the drawings, size and thickness of each element are arbitrarily represented for better understanding and ease of description, but the inventive concept is not limited thereto. In the drawings, the thickness of layers, films, panels, regions, etc., are exaggerated for clarity. In addition, in the drawings, the thicknesses of some layers and regions are exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In the drawings, a symbol "x" is used to indicate a first direction, a symbol "y" indicates a second direction perpendicular to the first direction, and a symbol "z" indicates a third direction perpendicular to the first direction and the second direction. The first direction x, the second direction y, and the third direction z may correspond to the horizontal direction, the vertical direction and the thickness direction of the electronic device, respectively.

Unless otherwise specified in the specification, "overlap" means to overlap in a plan view in the third direction z.

FIG. 1 is a side view of a display device according to an embodiment.

Referring to FIG. 1, a display device 1 according to an embodiment includes a display panel 10. The display panel 10 includes a display area DA where an image is displayed, and a non-display area NA that is disposed at the periphery of the display area DA and where elements and/or wires for generation and/or transmission of various signals applied to the display area DA are formed.

A plurality of pixels PX are arranged, for example, in a matrix format, in the display area DA. Signal lines such as gate lines (not shown), data lines (not shown), and the like are also disposed in the display area DA. The data lines may extend substantially in a first direction x (i.e., a column direction), and the gate lines may extend substantially in a second direction y (i.e., a row direction) that crosses the first direction x. Each pixel PX is connected with the gate line and the data line, and may receive a gate signal and a data voltage (also referred to as a data signal) from the signal lines. In case of a light emitting display device, driving voltage lines that transmit a driving voltage to pixels may be disposed in a display area DA, and light emission control lines transmitting a light emission control signal and/or initialization voltage lines transmitting an initialization voltage may be further disposed in the display area DA.

The display panel 10 may include touch electrodes (also called touch sensor layers) for sensing a user's contact or non-contact touch, and the touch electrodes may be mainly located in the display area DA.

The display panel 10 may include a first substrate 100 and a second substrate 200. When the display device 1 is provided as a liquid crystal display (LCD), a liquid crystal layer may be disposed between the first substrate 100 and the second substrate 200. When the display device 1 is provided as a light emitting display device, light emitting diodes may be disposed between the first substrate 100 and the second substrate 200.

A pad portion PP where pads P are arranged to receive signals from the outside of the display panel 10 may be located at a side surface of the display panel 10. The pads P of the pad portion PP may be connected with signal lines 101 that may be located between the first substrate 100 and the second substrate 200 in the non-display area NA. Thus, signals input to the pads P may be transmitted to the signal lines 101 disposed in the display panel 10. The signal lines 101 may be connected with signal lines 102 of the display area DA or may be extension portions of the signal lines 102 of the display area DA.

The pads P may be located in at least one of a side surface of the first substrate 100 and a side surface of the second substrate 200. In the illustrated embodiment, the pads P include portions located at the side surface of the first substrate 100, and include portions extending onto the top surface of the first substrate 100 for connection with the signal lines 101.

The display device 1 may include a printed circuit film 20 bonded to the pad portion PP. The printed circuit film 20 may include a lead portion LP where leads are arranged, and the leads L of the lead portion LP may be electrically connected with the pads P of the pad portions PP. One end of the printed circuit film 20 is connected to a printed circuit board (not shown) and the like to receive signals such as image data, a driving signal, a driving voltage, and the like. The printed circuit film 20 may be flexible, and may be bent such that most of the printed circuit film 20, excluding the lead portion LP, may be located at a rear side of the display panel 10. As described, when the pad portion PP is located at the side surface of the display panel 10 and the printed circuit film 20 is bonded to the side surface of the display panel 10, the non-display area NA for bonding of the printed circuit film 20 is not needed, thereby reducing a bezel of the display device 1.

A driving device that generates and/or processes various signals for driving the display panel 10 may be located in the printed circuit film 20 or the non-display area NA. The driving device may include a data driver applying a data voltage to data lines, a gate driver applying a gate signal to gate lines, and a signal controller controlling the data driver and the gate driver.

The data driver may be provided as an IC chip 30. The IC chip 30 may be located on the printed circuit film 20. As shown in FIG. 1, the printed circuit film 20 may be bent, and the IC chip 30 may be located at the rear side of the display panel 10. The gate driver may be integrated onto the non-display area NA of the display panel 12 as a driving circuit. The gate driver may be provided in the form of an IC chip, and in this case, the gate driver may be disposed on the printed circuit film and the printed circuit film may be bonded to the display panel 10. The signal controller may be provided in the form of an IC chip, and may be located on a printed circuit board to which the printed circuit film 20 is connected.

Figure 2:
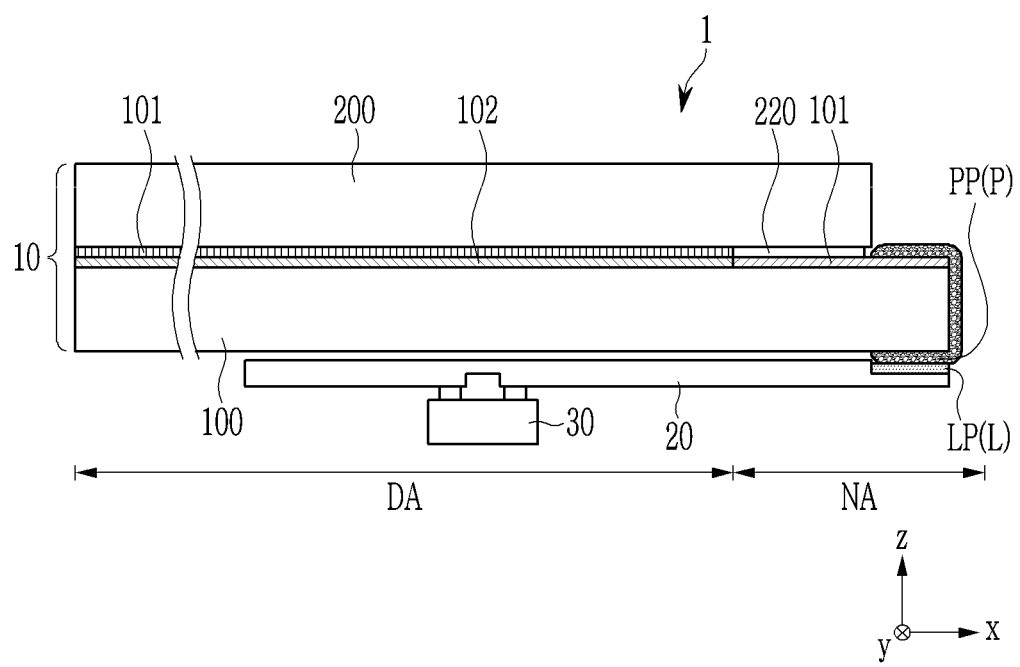
FIG. 2 is a side view of a display device according to an embodiment.

FIG. 2 is a side view of a display device according to an exemplary embodiment.

Unlike in the embodiment of FIG. 1, in an embodiment of FIG. 2, a printed circuit film 20 is bonded to a rear side of a display panel 10. For this, the pads P include first portions that are disposed on a rear surface of the first substrate 100 adjacent to one edge of the first substrate 100, and second portions disposed on a side surface of the first substrate 100 and third portions disposed a top surface of the first substrate 100. As described, when the printed circuit film 20 is bonded to the rear side of the display panel 10, a width of the non-display area NA can be more reduced by as much as at least the thickness of the printed circuit film 20 compared to the embodiment of FIG. 1.

Figure 3:
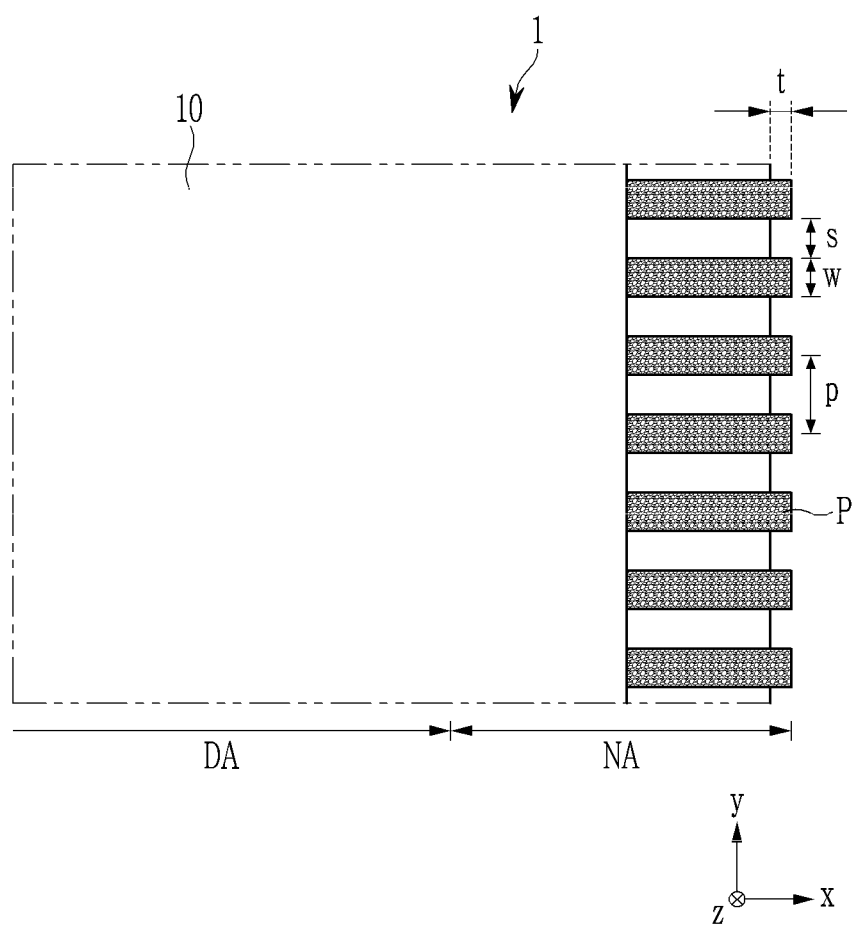
FIG. 3 is a top plan view of the display device shown in FIG. 2.

FIG. 3 is a top plan view of the display device 1 shown in FIG. 2.

FIG. 3 shows the periphery of the pad portion PP in the display device 1 of FIG. 2. Excluding the printed circuit film 20 in the display device 1 of FIG. 1, the display device 1 of FIG. 3 may have the same planar structure as that of FIG. 1.

In order to correspond to high resolution, the number of signals transmitted to the display panel 10 needs to be increased such that the number of pads P also needs to be increased. It is required to reduce a pad pitch p to increase the number of pads P in the limited area of the pad portion PP. For example, the pad pitch p may be about 20 μm or less or about 10 μm or less. For such a pad pitch p, a pad width w may be about 10 μm or less or about 5 μm or less, and a pad gap s may be about 10 μm or less or about 5 μm or less. A pad thickness t may be about 10% or more, about 20% or more, or about 30% of the pad width w. For example, when the pad width w is 10 μm, the pad thickness t may be 1 μm or more.

It may be difficult to form the pads P to surround side surfaces of the display panel 10 through a typical method which includes forming a conductive layer and then patterning the conductive layer through a photolithography process. The pads P may be formed by printing and drying through an inkjet method using a conductive ink. When the pads P are formed by using the inkjet method, the pad width w may be determined by the amount of droplets of ink discharged from an inkjet nozzle. For example, when forming the pads P having a pad width w of less than about 10 μm, the amount of ink droplet needs to be reduced, and then the pad thickness t becomes too thin to serve as a pad or a wire. Therefore, in order to reduce resistance and improve reliability, the pad thickness t needs to be greater than a certain level, for example more than 10% of the pad width w, and for this, the printing may be repeated several tens to several hundred times in the same position to form pads P having a thickness greater the certain level. However, such a method has a problem of increasing process time and requiring complicated equipment.

Figure 4:
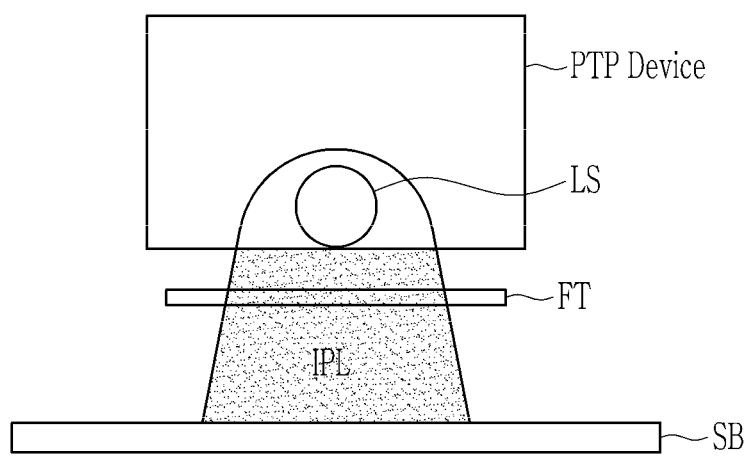
FIG. 4, FIG. 5 and FIG. 6 show a conductive pattern forming method according to an embodiment.
Figure 5:
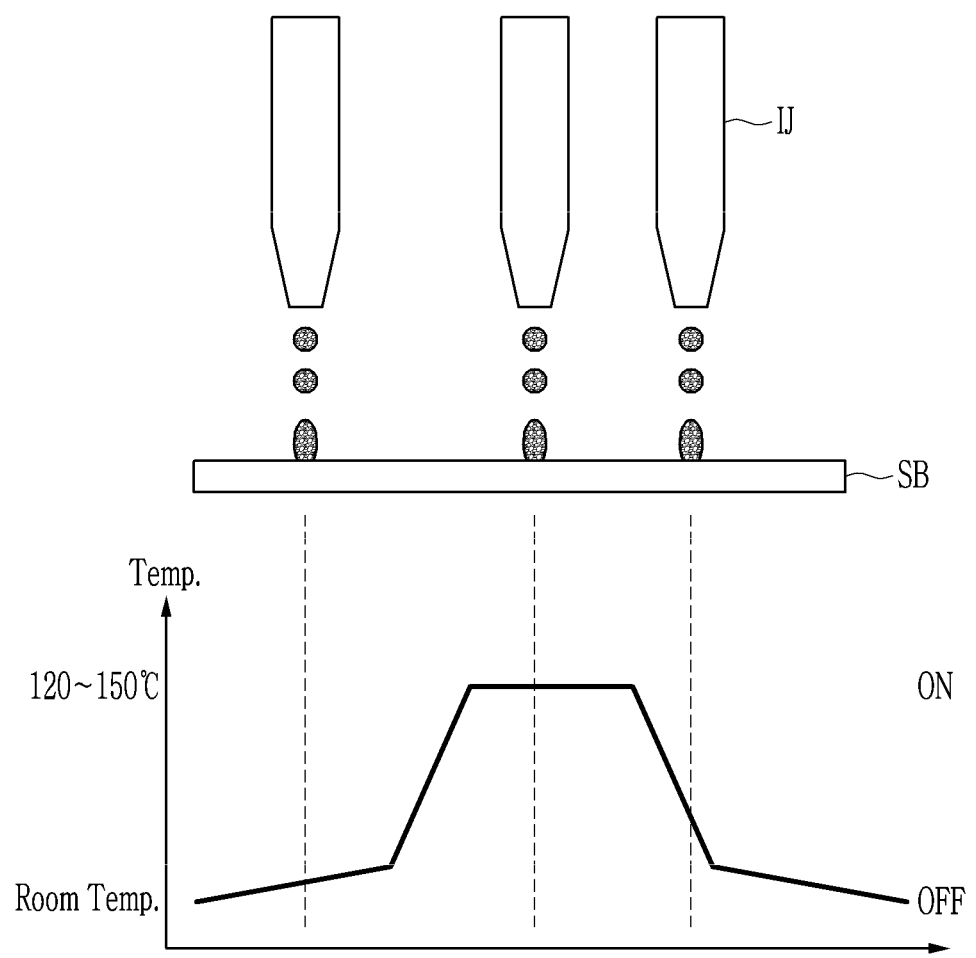
Figure 6:
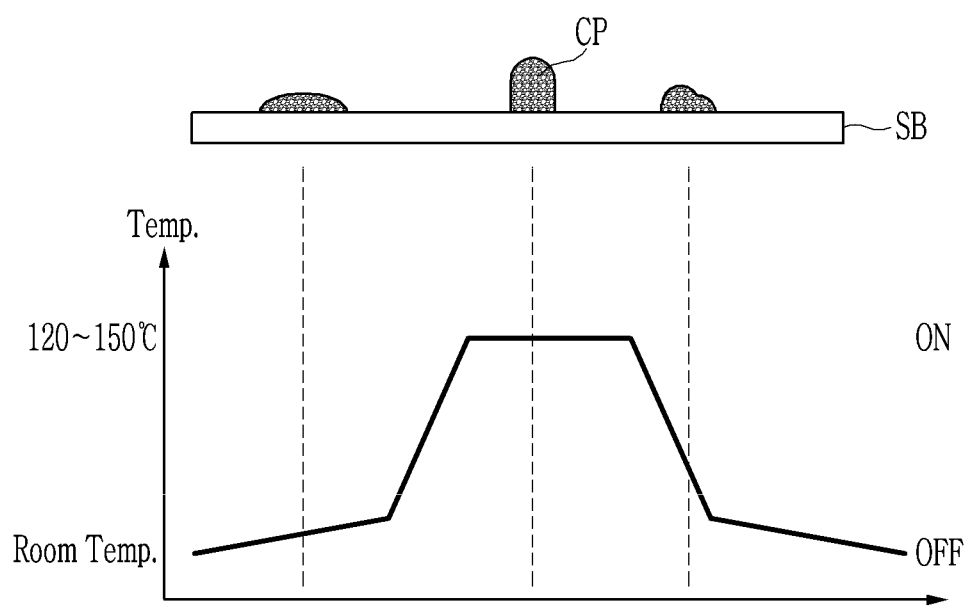

FIG. 4, FIG. 5, and FIG. 6 show a conductive pattern forming method according to an embodiment.

Referring to FIG. 4, in order to form minute conductive patterns such as pads P each having a minute pad width w, wires, and bumps through an inkjet method, a step for controlling a temperature of the substrate SB, for example, heating the substrate SB where minute conductive patterns are formed, is included. Intense pulsed light (IPL) may be irradiated onto the substrate SB for heating the substrate SB. The IPL may be irradiated by using a pulse thermal processing (PTP) device including a light source (LS) that is capable of applying optical energy of peak radiation power of several to several tens of kW/cm$^2$ in a short duration of microseconds (μs) to milliseconds (ms). The light source LS of the IPL may be a flash lamp using xenon (Xe). As the pulse thermal processing device, for example, NovaCentrix's PulseForge® series can be used.

Referring to FIG. 4 and FIG. 5, the IPL may be irradiated to the substrate SB right before dropping conductive ink. A temperature of the surface of the substrate SB may reach a temperature at which a solvent in the conductive ink is evaporated within several milliseconds by light of high energy irradiated to the substrate SB. The IPL may instantly heat the surface temperature of the substrate SB to about 80° C. or more, for example, about 100° C. to about 200° C. or about 120° C. to about 150° C. in a sort duration of time.

Unlike a laser light, the IPL may have a wideband wavelength which includes the visible spectral range of 400 to 1200 nm. Thus, a filter FT may be used to selectively filter out a specific wavelength range. For example, when the substrate SB includes a polymer such as polyimide, polyamide, polyethylene, polyethylene terephthalate, and the like, a filter FT that blocks ultraviolet (UV) may be used to prevent dissolution of the polymer. Unlike the laser light, IPL can shorten the process time because it can irradiate a large area with a single shot of a light source LS such as a flashlamp. Unlike heat treatment in an oven, IPL heats the surface of the substrate SB to a predetermined temperature in a very short time (e.g., less than milliseconds), thus preventing or minimizing damage to the substrate SB.

The conductive ink may be a metal ink in which minute conductive particles, for example, nanoparticles of metals such as copper (Cu), silver (Ag), gold (Au), platinum (Pt), palladium (Pd), tungsten (W), nickel (Ni), tantalum (Ta) bismuth (Bi), lead (Pb), indium (In), tin (Sn), zinc (Zn), titanium (Ti), and aluminum (Al), are dispersed in a solvent. The conductive ink may be a conductive polymer ink prepared using a conductive polymer such as PEDOT-PSS, polyaniline, polypyrrole, polythiophene, and the like.

Referring to FIG. 6, the conductive ink printed and drawn with inkjets IJ in a region heated to a predetermined temperature in the substrate SB rapidly increases in viscosity such that spreadability (or wettability) is decreased. Thus, the conductive ink can be solidified quickly on the substrate SB before spreading onto the substrate SB, and can form a conductive pattern CP having a predetermined thickness (e.g., about 10% or more of the pad width w), while maintaining a fine width of about 10 μm or less than about 5 μm (see conductive pattern CP at a middle of the substrate SB). On the contrary, the conductive ink printed in the region that is not heated (see conductive pattern CP at a left side of the substrate SB) or not sufficiently heated (see conductive pattern CP at a right side of the substrate SB) in the substrate SB, does not form a minute pattern having enough thickness with a minute pad width due to low viscosity.

After printing the conductive ink on the substrate, high energy IPL is irradiated to the conductive pattern CP to sinter the conductive pattern to ensure high strength and a high adhesion to the substrate SB.

FIG. 7 to FIG. 12 show a conductive pattern forming method according to an embodiment.

Not as in the previous embodiment in which the conductive pattern is formed by using the inkjet method, in an embodiment of FIG. 7 to FIG. 12, a conductive pattern CP is formed by using a transfer substrate TS and a release layer RL.

Figure 7:
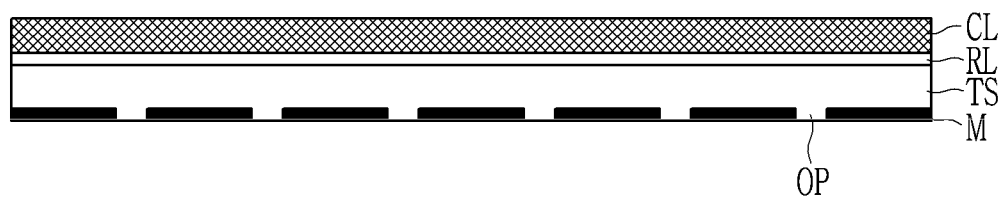
FIG. 7, FIG. 8, FIG. 9, FIG. 10, FIG. 11, and FIG. 12 show a conductive pattern forming method according to an embodiment.

Referring to FIG. 7, a release layer RL such as a dynamic release layer is stacked on a transfer substrate TS, and the conductive layer CL is formed on the release layer RL.

As the transfer substrate TS, a transparent substrate such as a glass substrate can be used. The transfer substrate TS may have a characteristic of transmitting IPL such that light energy can be transmitted through the transfer substrate TS. A mask M, which can transmit light with a predetermined pattern, may be formed in or attached to one side of the transfer substrate TS. In the drawing, the mask M is disposed on one surface of the transfer substrate TS which opposes a surface of the transfer substrate TS on which the release layer RL is disposed. However, the mask M may be disposed between the transfer substrate TS and the release layer RL. Openings OP may be formed corresponding to areas in which conductive patterns are to be formed.

The release layer RL may be formed by coating a material such as an ultraviolet degradable photopolymer and the like on the transfer substrate TS, or may be formed by attaching the material on the transfer substrate TS by using an adhesive. As the UV degradable photopolymer, a triazene polymer and the like may be used. The release layer RL may serve as a light-to-heat conversion layer.

The conductive layer CL may be formed through various methods such as coating, deposition, and the like. For example, the conductive layer CL may be a metal layer, and may be a coating layer formed by applying metal paste or metal ink.

Figure 8:
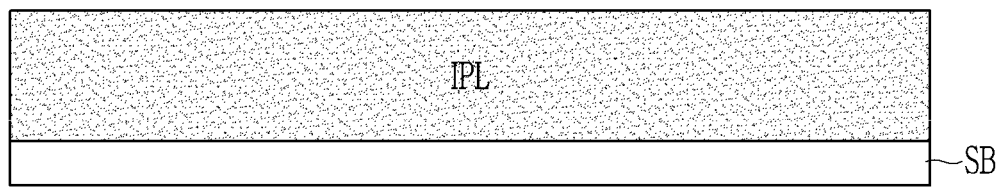

Referring to FIG. 8, like the embodiment of the inkjet type described above, the substrate SB on which the conductive pattern is to be formed is irradiated with IPL such that the surface of the substrate SB is heated to a predetermined temperature. The IPL may be irradiated by using a pulse thermal processing (PTP) device including a light source (LS) that is capable of applying optical energy of peak radiation power of several to several tens of kW/cm$^2$ in a short duration of microseconds (μs) to milliseconds (ms).

Figure 9:
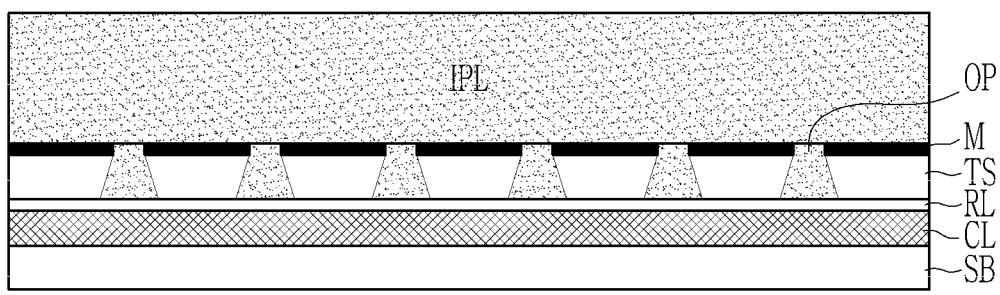
Figure 10:
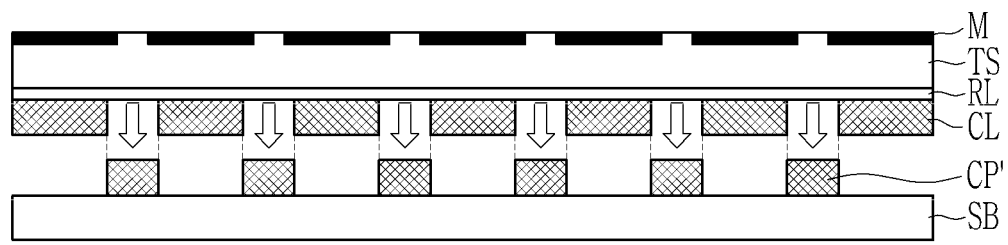

Referring to FIG. 9 and FIG. 10, the IPL is irradiated to the transfer substrate TS while the transfer substrate TS is placed on the substrate SB. The transfer substrate TS is disposed so that a surface on which the release layer RL and the conductive layer CL are located faces the substrate SB. The IPL passed through the opening OP of the mask M may melt a conductive layer portion CP' corresponding to the opening OP of the mask M or may increase fluidity of the conductive layer portion CP'. In addition, due to the IPL irradiated through the opening OP of the mask M, a blister is generated at a region corresponding to the opening OP of the mask M at an interface between the release layer RL and the transfer substrate TS by local heating. The release layer RL may be a light-to-heat conversion layer that generates heat when illuminated by IPL, and the blister may expand by the generated heat. When the blister expands, the release layer RL may be melted or may push away the conductive layer portion CP' with increased fluidity, and accordingly, the conductive layer portion CP' may be transferred from the transfer substrate TS toward the substrate SB.

Figure 11:
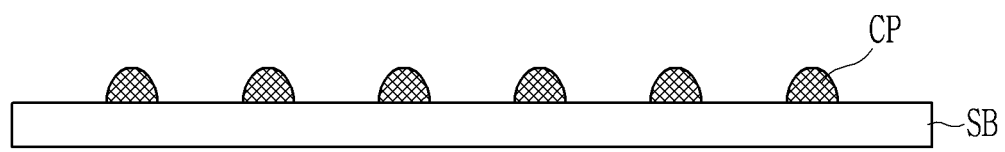

Referring to FIG. 11, the transferred conductive layer portion CP' forms a conductive pattern CP on the substrate SB. As previously described with reference to FIG. 8, since the substrate SB is heated before the transferred conductive layer portion CP' is attached to the substrate SB, the conductive layer portion CP' attached to the substrate SB may be quickly solidified on the substrate SB without spreading such that a conductive pattern CP having a minute width and a large thickness may be formed on the substrate SB.

Figure 12:
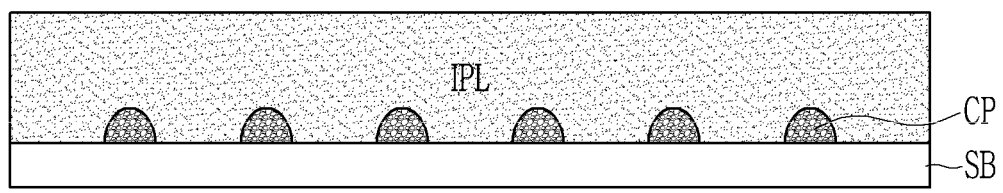

Next, referring to FIG. 12, high energy IPL is irradiated again to the conductive pattern CP to sinter the transferred conductive layer portion CP' to provide the conductive pattern with high strength and high adhesion to the substrate.

Since IPL can be irradiated uniformly over a large area, the processing time for heating the substrate SB, transferring the conductive pattern CP from the transfer substrate TS to the substrate SB, and sintering the conductive pattern CP can be dramatically reduced compared to, for example, when using a laser. In addition, a conductive pattern CP including a plurality of wires having a minute width and a large thickness can be formed at one time. The conductive pattern CP may have a width of about 10 μm or less or about 5 μm or less, and a thickness may be 10% or more, about 20% or more, or about 30% or more of the width.

Figure 13:
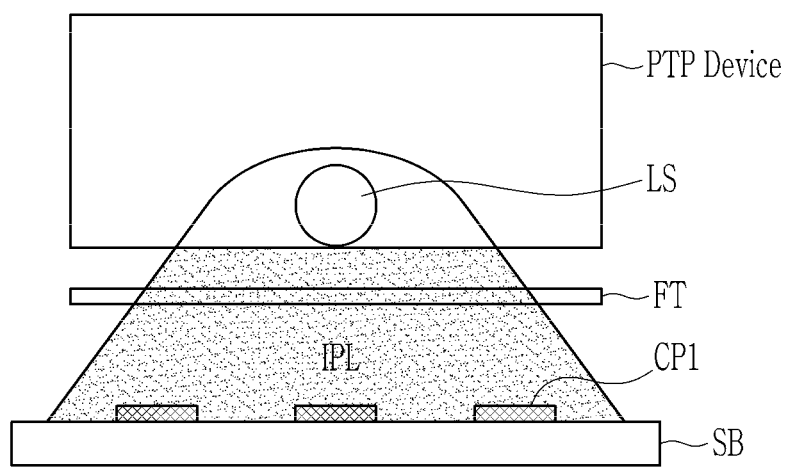
FIG. 13 and FIG. 14 show a conductive pattern forming method according to an embodiment.
Figure 14:
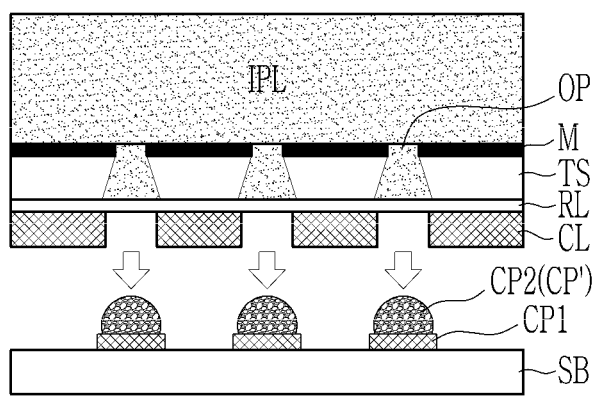

FIG. 13 and FIG. 14 show a conductive pattern forming method according to an embodiment.

The embodiment shown in FIG. 13 and FIG. 14 is generally similar to the embodiment of FIG. 7 to FIG. 12, except that a second conductive pattern CP2 is formed on a first conductive pattern CP1, which has been already formed. The second conductive pattern CP2 may be a bump.

The first conductive pattern CP1 may be formed by forming a conductive layer through deposition and the like and then patterning the conductive layer, or may be formed by using the transfer substrate, the release layer, and IPL as disclosed in the embodiment according to FIG. 7 to FIG. 12. The first conductive pattern CP1 may be a terminal electrode or a wire.

The second conductive pattern CP2 may be formed by using the transfer substrate TS, the release layer RL, and IPL as in the embodiment of FIG. 7 to FIG. 12. Thus, IPL is irradiated to a substrate SB where the first conductive pattern CP1 is formed to heat a surface of the first conductive pattern CP1 to a predetermined temperature so as to form the second conductive pattern CP2. Next, a transfer substrate TS where a release layer RL and a conductive layer CL are stacked is placed on the substrate SB, and then IPL is irradiated to the transfer substrate TS to transfer a conductive layer portion CP' corresponding to an opening OP of a mask M to the substrate SB from the transfer substrate TS. The transferred conductive layer portion CP' forms the second conductive pattern CP2 on the first conductive pattern CP1. Since a surface of the first conductive pattern CP1 is heated, the conductive layer portion CP' on the first conductive pattern CP1 may be solidified on the substrate SB without spreading such that the second conductive pattern CP2 having a minute width and a large thickness can be formed. The second conductive pattern CP2 may have a width of about 10 μm or less or about 5 μm or less, and the thickness may be about 10% or more, about 20% or more, or about 30% or more of the width.

After transferring the conductive layer portion CP' on the first conductive pattern CP1, IPL is irradiated on the substrate SB again to sinter the second conductive layer portion CP' to form the second conductive pattern CP2 having an increased strength and an increased adhesion to the first conductive pattern CP1. The second conductive pattern CP2 may be formed by using the inkjet method as in the embodiment of FIG. 4 to FIG. 6.

The second conductive pattern CP2 may function as a bump. The bump refers to a conductive protrusion formed on a chip pad for connecting an electronic component such as an IC chip to a substrate in a manner such as tape automated bonding (TAB) or a flip chip. The bump serves to increase the thickness of a pad conductor to facilitate connection between IC chip and the substrate.

When a display panel, a printed circuit film, a flexible printed circuit (FPC), etc. to which the IC chip having the bump is attached includes pads having a large step, uniform connection between the bump in the IC chip and the pad on the display panel, the printed circuit film, the flexible printed circuit (FPC), etc. may not be established and poor connection may occur between some bumps and pads. The second conductive pattern CP2 formed on the first conductive pattern CP1 in the present embodiment may be formed by sintering a metal paste (e.g., a silver (Ag) paste), and thus pores may exist between metal particles that form the second conductive pattern CP2. Thus, the second conductive pattern CP2 may be easily deformed by an external pressure, compensate a step between pads of the display panel, the printed circuit film, the flexible printed circuit (FPC), etc., and reduce a process pressure during bonding (e.g., to about 1/20 of a process pressure during bonding of a typical copper/tin (Cu/Sn) bump or a solder bump). In addition, the bump formed by sintering the metal paste may lower a process temperature during bonding as compared to the conventional solder bump. For example, a bump formed by using the silver (Ag) paste may be bonded at about 30° C. to about 80° C. Owing to the lowered process temperature during bonding, expansion and deformation of a printed circuit film, the substrate and the like can be reduced.

Figure 15:
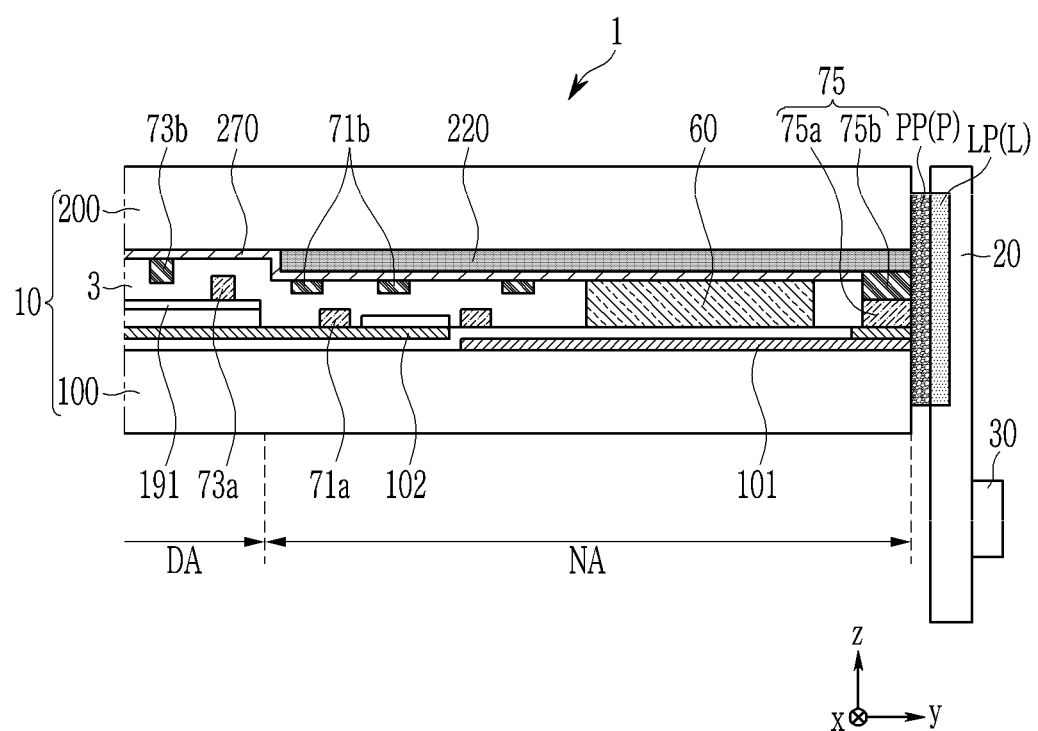
FIG. 15 is a cross-sectional view of a display device according to an embodiment.
Figure 16:
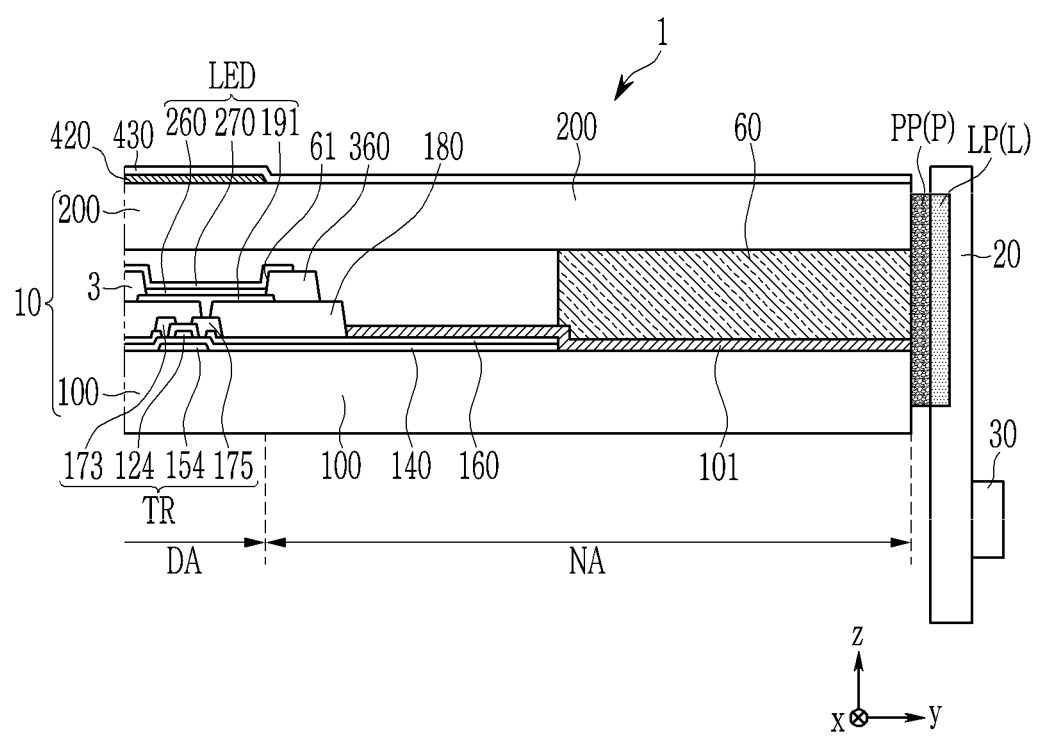
FIG. 16 is a cross-sectional view of a display device according to an embodiment.

Hereinafter, a cross-sectional structure of a display device according to an embodiment will be described with reference to FIG. 15 and FIG. 16. FIG. 15 and FIG. 16 are cross-sectional views of display devices according to embodiments, respectively.

Referring to FIG. 15, a display device 1 may be a liquid crystal display, and a display panel 10 may include a first substrate 100, a second substrate 200, and a liquid crystal layer 3 disposed between the first substrate 100 and the second substrate 200. The first substrate 100 and the second substrate 200 may be transparent insulation substrates such as glass.

A circuit portion that includes transistors and signal lines 101 and 102 may be located on the first substrate 100. Such a circuit portion may be formed to charge a data voltage in a liquid crystal capacitor that forms each pixel at predetermined timing. A pixel electrode 191 that is connected with the transistor may be located on the circuit portion in the display area DA, and an alignment layer may be located on the pixel electrode 191.

A light blocking layer 220 may be located in a non-display area NA on the second substrate 200. The light blocking layer 220 may prevent light leakage or light reflection due to the metal layer in the non-display area NA. A common electrode 270 may be located on the second substrate 200, and the alignment layer may be located on the common electrode 270. However, the common electrode 270 may be disposed on the first substrate 100.

The pixel electrode 191, the common electrode 270, and the liquid crystal layer 3 may form a liquid crystal capacitor. An electric field corresponding to a difference between a data voltage applied to the pixel electrode 191 and a common voltage applied to the common electrode 270 may be applied to the liquid crystal layers 3. When the intensity of the electric field is changed by changing the magnitude of the data voltage, alignment of liquid crystal molecules in the liquid crystal layer 3 can be changed, and light transmittance can be adjusted by changing the alignment of the liquid crystal molecules, thereby adjusting luminance of each pixel and displaying an image from combination of the pixels.

The first substrate 100 and the second substrate 200 are bonded by a sealant 60 that is located in the non-display area NA and surrounds the display area DA. Dams 71a may be located on the first substrate 100 in the non-display area DA to prevent a solution (alignment solution) that includes a material for forming the alignment layer from flowing toward the sealant 60. For the same reason, dams 71b may be located above the second substrate 200. Spacers 73a and 73b may be located on the first substrate 100 and/or the second substrate 200 to maintain a gap between the first substrate 100 and the second substrate 200. The spacers 73a and 73b may include an organic insulating material. The dams 71a and 71b and the spacers 73a and 73b may be formed of the same material through the same process, or may be formed through individual processes.

An edge filler 75 may be located at an outer edge of the sealant 60 in the display panel 10. The edge filler 75 may fill a gap that may exist between the first substrate 100 and the second substrate 200 on the side of the display panel 10. Accordingly, the edge filler 75 can prevent the pads P from being lifted by increasing an adhesive force between the pads P and a side surface on which the pads P are formed during a process for forming the pads P on the side surface of the display panel 10. The pads P may contact the side surface of the edge filler 75. The edge filler 75 may also prevent the sealant 60 from overflow outside the display panel 10. The edge filler 75 may have a structure in which a structure 75a disposed on the first substrate 100 and a structure 75b disposed on the second substrate 200 are contact each other directly. The structures 75a and 75b may be formed of the same material as the spacers 73a and 73b through the same material as the spacers 73a and 73b, for example, the same organic insulating material. A side surface of the edge filler 75 may be aligned with the side surfaces of the first substrate 100 and the second substrate 200.

The pads P may be located on the side surface of the display panel 10. Unlike the embodiment of FIG. 1, the side surface of the first substrate 100 may be aligned with the side surface of the second substrate 200. The pads P may be located on both the side surface of the first substrate 110 and the side surface of the second substrate 200. As described, when the pad portion PP of the display panel 10 are formed on the side surfaces of the display panel 10, the width of the non-display area NA can be more reduced, and an area where the printed circuit film 20 is bonded can be increased.

Referring to FIG. 16, a difference from the embodiment of FIG. 15 will be mainly described, and in an embodiment of FIG. 16, a display device 1 is exemplarily provided as a light emitting display device.

A display device 1 includes a display area DA and a non-display area NA.

The display panel 10 includes a first substrate 100, and a semiconductor layer 154 of a transistor TR may be disposed on the first substrate 100. The semiconductor layer 154 may include a channel region, a source region, and a drain region. The source region and the drain region are disposed at opposite sides of the channel region. The semiconductor layer 154 may include a polysilicon, an amorphous silicon, or an oxide semiconductor.

A buffer layer may be disposed between the first substrate 100 and the semiconductor layer 154 to prevent dispersion of an impurity that deteriorates a characteristic of the semiconductor layer 154 and to prevent permeation of moisture and the like.

A first insulation layer 140 may be located on the semiconductor layer 154. The first insulation layer 140 may include an inorganic insulating material such as a silicon oxide (SiOx), a silicon nitride (SiNx), and the like.

A gate conductor that may include a gate electrode 124 of the transistor TR and gate lines may be located on the first insulation layer 140. The gate electrode 124 may overlap a channel region of the semiconductor layer 154. The gate conductor may include a metal such as molybdenum (Mo), copper (Cu), aluminum (Al), silver (Ag), chromium (Cr), tantalum (Ta), titanium (Ti), and the like.

A second insulation layer 160 that may include an inorganic insulating material may be located on the gate conductor. A data conductor that may include a source electrode 173 and a drain electrode 175 of the transistor TR, data lines, driving voltage lines, and the like may be located on the second insulation layer 160. The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like.

The source electrode 173 and the drain electrode 175 may be respectively connected to a source region and a drain region of the semiconductor layer 154 through openings of the second insulation layer 160. The gate electrode 124, the source electrode 173, the drain electrode 175, and the semiconductor layer 154 form the transistor TR.

A third insulation layer 180 may be disposed on the second insulation layer 160 and the data conductor. The third insulation layer 180 may include an organic insulating material.

A pixel electrode 191 may be disposed on the third insulation layer 180. The pixel electrode 191 may be connected with the source electrode 173 or the drain electrode 175 of the transistor TR through an opening formed in the third insulation layer 180. The pixel electrode 191 may be formed of a reflective conductive material or a semi-transparent conductive material, or may be formed of a transparent conductive material. The pixel electrode 191 may include a transparent conductive material such as indium tin oxide (ITO), indium zinc oxide (IZO), and the like. The pixel electrode 191 may include a metal such as lithium (Li), calcium (Ca), aluminum (Al), silver (Ag), magnesium (Mg), gold (Au), and the like.

A fourth insulation layer 360 may be disposed on the third insulation layer 180 and the pixel electrode 191. The fourth insulation layer 360 may include an opening 61 that overlaps the pixel electrode 191. The opening 61 of the fourth insulation layer 360 may limit an area that corresponds to a light emission area of a pixel. The fourth insulation layer 360 may include an organic insulating material such as polyimide, polyacrylate, and the like.

A light emitting layer 260 that includes an emission layer may be disposed on the pixel electrode 191. A common electrode 270 that transmits a common voltage may be disposed on the light emitting layer 260. The common electrode 270 may include a transparent conductive material such as indium tin oxide (ITO), indium zinc oxide (IZO), and the like. The common electrode 270 may be formed to have light transmittance by controlling a thickness of common electrode forming material such as calcium (Ca), barium (Ba), magnesium (Mg), aluminum (Al), silver (Ag), and the like. At least one protection layer or function layer may be disposed on the common electrode 270.

The pixel electrode 191, the light emitting layer 260, and the common electrode 270 of each pixel may form a light emitting diode LED. The light emitting diode LED may be an organic light emitting diode (OLED). The pixel electrode 191 may be an anode, which is a hole injection electrode, and the common electrode 270 may be a cathode, which is an electron injection electrode, or vice versa. Holes and electrons are injected into the light emitting layer 260 from the pixel electrode 191 and common electrode 270, respectively, and light is emitted when excitons, in which the injected hole and the electron combine, fall from an exited state to a ground state.

The display panel 10 may include a second substrate 200 that faces the first substrate 100. A touch sensor layer that includes a touch electrode 420 may be located on the second substrate 200. The touch sensor layer may be used to sense contact and/or non-contact touch of a user. The touch electrode 420 may be located in the display area DA. The touch electrode 420 may be formed of a transparent conductive material, a metal mesh, a conductive polymer, and the like. A protective layer 430 such as an insulation layer may be disposed on the touch electrode 420. The touch electrode 420 may be located on an inner side of the second substrate 200 (i.e., a side that faces the first substrate 100), or may be formed on a separate substrate and thus attached to the second substrate 200.

A sealant 60 disposed between the first substrate 100 and the second substrate 200 may air-tightly seal the display panel 10 while bonding the first substrate 100 and the second substrate 200.

A pad portion PP where pads P connected with signal lines 101 may be located at a side surface of the display panel 10. A printed circuit film 20 that includes a lead portion LP may be bonded to the pad portion PP.

While the inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A conductive pattern forming method comprising:
    sequentially forming a release layer and a conductive layer on one side of a transfer substrate, the release layer being disposed between the transfer substrate and the conductive layer;
    placing a mask on the other side of the transfer substrate;
    irradiating first intense pulsed light (IPL) to a first surface of a substrate without a mask overlapping the substrate to heat the substrate, the first IPL being irradiated directly to the substrate without any other layer disposed between the first IPL and the substrate;
    placing the transfer substrate on the substrate which is irradiated and heated by the first IPL without forming an additional layer on the substrate; and
    transferring a portion of the conductive layer, corresponding to an opening of the mask onto the substrate by irradiating second IPL to the transfer substrate to form a conductive pattern on the first surface of the substrate,
    wherein no portion of the release layer is transferred onto the substrate during the transferring the portion of the conductive layer.

2. The conductive pattern forming method of claim 1, wherein the conductive layer is formed by applying a metal paste or metal ink.

3. The conductive pattern forming method of claim 1, wherein the conductive layer is a metal layer.

4. The conductive pattern forming method of claim 1, wherein the release layer is a dynamic release layer.

5. The conductive pattern forming method of claim 1, wherein the conductive pattern is the conductive layer corresponding to the opening of the mask.

6. The conductive pattern forming method of claim 1, wherein the placing the transfer substrate onto the substrate comprises placing a surface of the transfer substrate, on which the conductive layer is located, to face toward the substrate.

7. The conductive pattern forming method of claim 1, further comprising sintering the conductive pattern by irradiating third IPL to the substrate after the transferring the portion of the conductive layer onto the substrate.

8. The conductive pattern forming method of claim 1, wherein the conductive pattern has a width of about 10 µm or less and a thickness of about 10% or more of the width.

9. The conductive pattern forming method of claim 1, wherein the irradiating of the first intense pulsed light (IPL) to the substrate is performed before the placing of the transfer substrate on the substrate.

* * * * *